United States Patent
Schulmeyer et al.

(10) Patent No.: US 9,871,514 B1
(45) Date of Patent: Jan. 16, 2018

(54) METHODS AND APPARATUS FOR CONTINUOUS CURRENT LIMITING FOR FETS IN HIGH INDUCTIVE LOAD SYSTEMS

(71) Applicant: Texas Instruments Incorporated, Dallas, TX (US)

(72) Inventors: Kyle Schulmeyer, Plano, TX (US); Sualp Aras, Dallas, TX (US); Abidur Rahman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/196,323

(22) Filed: Jun. 29, 2016

(51) Int. Cl.
*H03K 17/687* (2006.01)
*H03K 5/08* (2006.01)
*H02M 3/07* (2006.01)

(52) U.S. Cl.
CPC .......... *H03K 17/687* (2013.01); *H02M 3/07* (2013.01); *H03K 5/08* (2013.01)

(58) Field of Classification Search
CPC .......... H02M 3/07; H03K 5/08; H03K 17/687
USPC .................. 327/108, 110, 574, 581
See application file for complete search history.

(56) References Cited

U.S. PATENT DOCUMENTS

| | | | | |
|---|---|---|---|---|
| 6,100,728 A * | 8/2000 | Shreve | ............... | H03K 17/0826 327/110 |
| 8,497,728 B2 * | 7/2013 | Mizobe | ............... | H02P 29/02 326/83 |
| 2006/0244498 A1 * | 11/2006 | Kohout | ............... | H03K 17/166 327/134 |
| 2007/0177322 A1 * | 8/2007 | Jacobs | ............... | H03F 1/52 361/100 |
| 2016/0028307 A1 * | 1/2016 | Illing | ............... | H02M 3/156 323/274 |

OTHER PUBLICATIONS

J. Korec and C. Bull, "History of FET Technology and the Move to NexFET," Bodo's Power Systems, May 2009, p. 44-45, Texas Instruments Incorporated, www.bodospower.com, accessed, Jun. 28, 2016, www.ti.com/lit/ml/slpa007/slpa007.pdf.

\* cited by examiner

*Primary Examiner* — William Hernandez
(74) *Attorney, Agent, or Firm* — Lawrence J. Bassuk; Charles A. Brill; Frank D. Cimino (57) ABSTRACT

An apparatus includes a FET device having a drain terminal, source terminal and a gate terminal; a first supply voltage coupled to the drain terminal of the FET; an output terminal coupled to the source terminal of the FET; a bias current supply coupled to the gate terminal of the FET; a second supply voltage coupled to the gate terminal of the FET; a current sensing circuit coupled to output a sense current proportional to the current flowing through the FET; a current limit comparator coupled to the sense current and comparing the sense current to a predetermined limit current; a pull down current circuit coupled to remove current from the gate terminal of the FET; a current time derivative circuit coupled to the sense current and outputting a sense rate current; and a circuit coupled to receive the sense rate current and coupled to the bias current supply.

20 Claims, 9 Drawing Sheets

METHODS AND APPARATUS FOR CONTINUOUS CURRENT LIMITING FOR FETS IN HIGH INDUCTIVE LOAD SYSTEMS

TECHNICAL FIELD

This application relates generally to the use of power transistors, and more particularly to the use of a power field effect transistor (FET) device to drive a high inductive load.

BACKGROUND

Power field effect transistors (FETs) are increasingly used to drive high inductive loads. In an example application, a power FET drives a headlamp or headlight in an automobile or other vehicle. The power FET is coupled between the power supply and a high current bulb using a cable to couple current from the power FET circuit to the headlamp. The cable and the bulb can present a high inductive load in excess of 5 μH. In an automotive example application, the inductive load can be in a range between 5-20 μH. The bulbs of some headlights presently in use require a very high current at turn on, in an example the "inrush" current (the current drawn at the initial turn on) for the headlight can be in the range of 90-100 Amperes.

The power FET has a safe operating area (SOA) of current and voltage that can be maintained without damage to the device. The SOA is determined by the manufacturer of the FET. The SOA indicates the current and voltage conditions that need to be maintained to ensure reliable operation without damage to the FET and to ensure that the FET will meet an expected lifetime of the product. In order to protect the power FET and keep the device operating within the recommended SOA, current limiting is utilized. However, if a very high current through the FET occurs that causes a current limiting circuit to shut down or to limit the current flowing in the FET device, the energy stored in the inductive load has to be discharged. Although the FET may be off or may be turning off, the FET is still in the circuit between the inductive load and the power supply, and the stored energy is discharged through the FET. The discharge of the inductor energy through the FET can cause undesirable device stress or can even destroy the FET because the SOA boundary conditions can be violated. A specific characteristic of a conventional current limit or shutdown of a power FET circuit is that there can be current overshoot at turn off or current limit of the FET that exceeds the boundary of the SOA for the FET.

SUMMARY

In described examples, an apparatus includes: a FET device having a drain terminal, a source terminal and a gate terminal; a first supply voltage coupled to the drain terminal of the FET; an output terminal coupled to the source terminal of the FET; a bias current supply coupled to the gate terminal of the FET; a second supply voltage coupled to the gate terminal of the FET; and a current sensing circuit coupled to output a sense current proportional to the current flowing through the FET. A current limit comparator coupled to the sense current compares the sense current to a predetermined limit current; a pull down current circuit is coupled to remove current from the gate terminal of the FET; a current time derivative circuit coupled to the sense current and outputs a sense rate current; and a circuit is coupled to receive the sense rate current and coupled to the bias current supply.

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
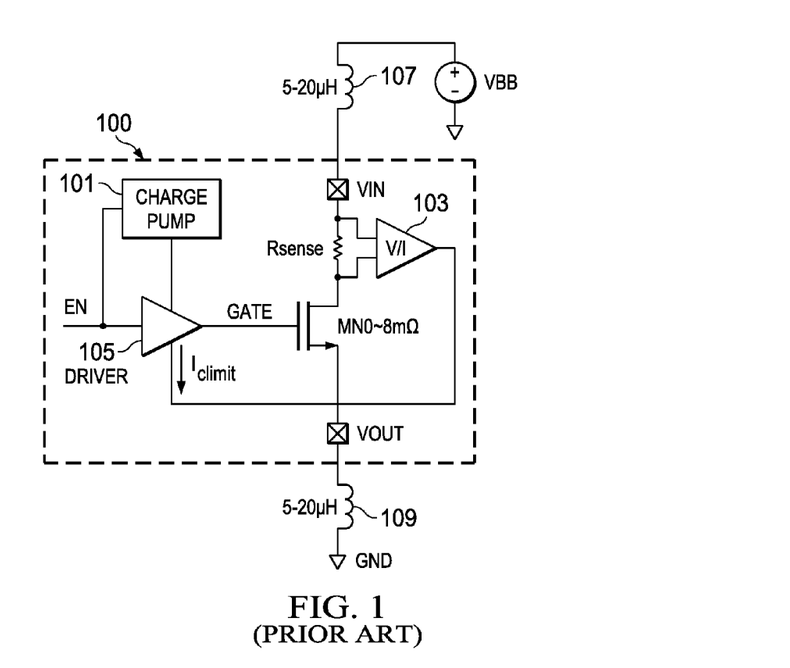
FIG. 1 illustrates in a circuit diagram a conventional high side power FET circuit and driver device coupled to an inductive load.

FIG. 1 depicts in a circuit diagram a conventional circuit using a power FET to supply current to an inductive load. In FIG. 1, the power FET MN0 is arranged as a "high side" driver, in that the power FET is coupled to a power supply at the drain terminal, and supplies current to the load from the source terminal. The FET MN0 in FIG. 1 is shown as an N-type FET. Note that in an alternative arrangement the FET MN0 could also be arranged as a P-type FET, with the drain and source terminals reversed. Various FET devices are available for power applications and these are applicable to the embodiments.

The gate conductor and gate insulator of a FET device form a capacitor with the semiconductor substrate. For a power FET, the gate capacitance can be quite large. To switch the power FET from an initial off state to an on state, the gate capacitor has to be charged. To then switch the FET from the on state to an off state, the gate capacitor has to be discharged. Because the switching speed of the FET is critical to proper operation of the circuit, gate driver devices are often coupled to the gate terminal of the FET to turn on, and turn off, the power FET. Substantial current can be supplied to the gate terminal or taken from the gate terminal of the power FET during switching operations, to charge and discharge the gate capacitor and turn the FET on, or off, as needed.

In FIG. 1, a conventional power FET circuit 100 is shown for driving a load as a high side driver. Power FET MN0 supplies voltage and current at terminal VOUT in response to a voltage and current at a gate terminal labeled GATE. A supply voltage VBB is coupled to the input terminal VIN for supplying the current to the drain to source current conduction path of the FET and then to the load at terminal VOUT. A driver circuit 105, which can also include additional FET devices, supplies the FET gate signal at the FET terminal GATE in response to an input enable signal labeled EN. In this example arrangement, the driver circuit 105 has power supplied from a charge pump 101. The charge pump 101 provides a voltage greater than the voltage VIN for driving the GATE signal. The output voltage at terminal VOUT can take high voltage levels close to the input VIN. This output voltage VOUT is at the source terminal of the FET MN-0. To turn on the transistor MN0 the voltage at the terminal GATE has to be raised above the source voltage by a transistor threshold voltage Vt. By raising the supply voltage to the FET GATE input substantially above the supply voltage VIN, the FET MN0 can always be turned on by driver 105. In one example, a charge pump outputs a pump voltage that was boosted by 13 Volts above VIN to the gate driver 105.

When supplying currents to a load, the FET MN0 is typically operated in the linear mode. In operation of the power FET in this mode, VOUT can be made approximately equal to VIN.

In FIG. 1, current limiting is applied to protect the power FET MN0. In an example automotive application, a cable coupled to the output VOUT at the source of the FET MN0 can be coupled to a load 109 such as a headlamp. If the headlight or the cable is damaged, for example due to a vehicle accident, a short to ground can occur. This is the case drawn in FIG. 1. In a shorting case the current drawn at the output VOUT can quickly exceed the current that the power FET MN0 can safely conduct. In FIG. 1 the load is shown with the bulb not shown but with a cable 109 represented as shorted to ground. A current sensing circuit is used to detect and limit the current flowing through the power FET MN0 to protect the power FET. In some applications, when the current limit is reached, the power FET can be disabled. In other applications, when the current limit is reached, the power FET is operated while conducting a maximum safe current, to continue supplying power to the load.

In FIG. 1, a sense resistor Rsense is coupled between the input voltage VIN and a drain terminal of the FET MN0. The current flowing through the resistor Rsense is the same as the output current (which is also the drain to source current or Ids current that flows through the FET MN0). A voltage developed across the sense resistor Rsense is therefore proportional to the FET current, due to the operation of Ohm's law. The voltage across the resistor Rsense is converted to a current by the voltage-to-current (V/I) converter 103. As the sensed current increases, the current labeled Iclimit in FIG. 1 modulates the gate current output from driver 105 and therefore reduces current into the GATE terminal. By limiting the current available, the drain to source current flowing through the power FET MN0 can be limited to a maximum level. In a critical application such as a headlamp driver application, the system may require that the FET continuously supply current to the load at a maximum safe current. This condition can also occur at startup, for example, when high inrush current has to be maintained during the initial turn on of the headlight.

A problem with the conventional power FET circuit of FIG. 1 is that when the FET MN0 is turned off, for example in response to a falling signal EN, the load 109 may have energy stored in it (particularly when driving an inductive load) that needs to be discharged. Without a path to discharge the gate capacitance of the FET, an undesirably long time can elapse before the FET turns off. During this time, the FET is in a series circuit with a discharging inductor (the load) and Ids current that exceeds the SOA conditions for the FET may occur, due to the large current flowing into it.

The circuit 100 is shown coupled to an inductive load 109 representing, for example, a cable normally coupled to a headlamp but shown shorted to ground. In automotive applications the load can range from about 5-20 µH. Other loads can be driven by the FET MN0.

Figure 2:
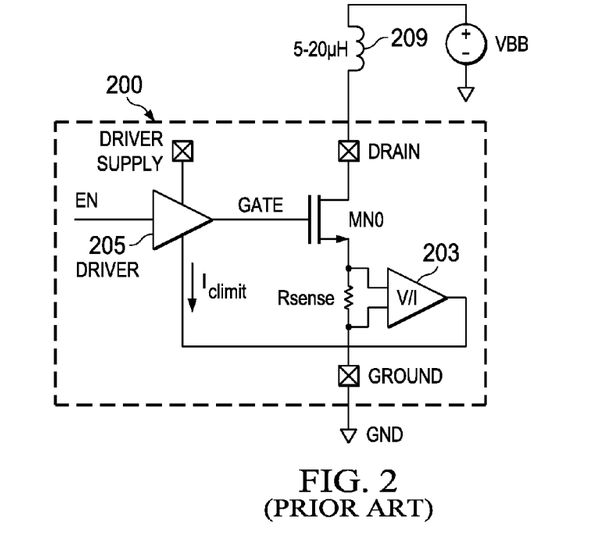
FIG. 2 illustrates in another circuit diagram a conventional low side power FET circuit and driver device coupled to an inductive load.

FIG. 2 illustrates in a second circuit diagram a conventional power FET circuit 200 for a low side driver application. The circuit 200 of FIG. 2 includes several components that are similar to and operate in the manner of the circuit 100 of FIG. 1 described hereinabove. In FIG. 2, the driver 205, the sense resistor Rsense, the voltage to current V/I circuit 203, and the power FET MN0 all correspond to the similar elements of FIG. 1, with the reference labels now changed from "1XX" in FIG. 1 to "2XX" in FIG. 2, for convenience. In FIG. 2, circuit 200 is supplied by a voltage at the terminal labeled "driver supply" while the power FET MN0 has the drain terminal "DRAIN" coupled to the load 209. The load in this example arrangement is series coupled between the supply voltage VBB and the drain of the power FET. In some examples this voltage VBB can be 12-13 Volts supplied from a lead acid battery. In other examples other voltages can be used, such as 24 Volts, 48 Volts, 6 Volts, or higher or lower voltages. In an example of a headlight switch, the load 209 includes the headlight and a cable connecting the battery to the headlight. The load 209 is shown as an inductor. In example automotive applications the inductor 209 can be in a range between 5-20 µH. Circuit 200 can drive other loads, as well.

In one difference between the high side and low side arrangements of FIG. 1 and FIG. 2, respectively, the FET gate terminal GATE in FIG. 2 does not need to be coupled to a boosted voltage as in FIG. 1. The source terminal of the FET MN0 in the low side driver configuration of FIG. 2 is coupled to ground through the sense resistor Rsense. The gate to source voltage needed to turn on the FET MN0 is now just a threshold voltage Vt, plus the voltage of the sense resistor Rsense, above ground, and so in this example, no charge pump is needed to supply the GATE voltage.

In operation of the circuit in FIG. 2, the FET MN0 allows current to flow through load 209 in response to the voltage at the gate terminal GATE, which is raised to a voltage at least above a threshold voltage Vt for the FET when the driver circuit 205 receives an enable signal EN. The current flowing through the load 209 is the same as the drain to source current conducted by the FET, and this same current flows through the sense resistor Rsense to ground. The voltage across resistor Rsense is proportional to the current flowing through the FET MN0 due to the operation of Ohm's law. The voltage is converted to current by the V/I or voltage to current converter 203. The FET current is limited by removing current from the driver 205 using the limit current Iclimit. Iclimit reduces the current into the power FET MN0 at the gate terminal GATE if the sensed current exceeds a threshold current level, in the same manner as the current limiting operation for the high side driver circuit in FIG. 1.

Figure 3A:
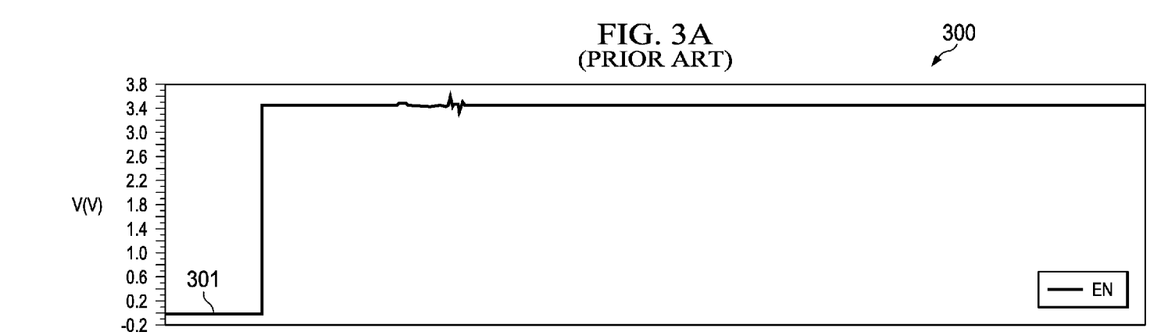
FIGS. 3A and 3B are two graphs illustrating a voltage and a current for a conventional power FET circuit.
Figure 3B:
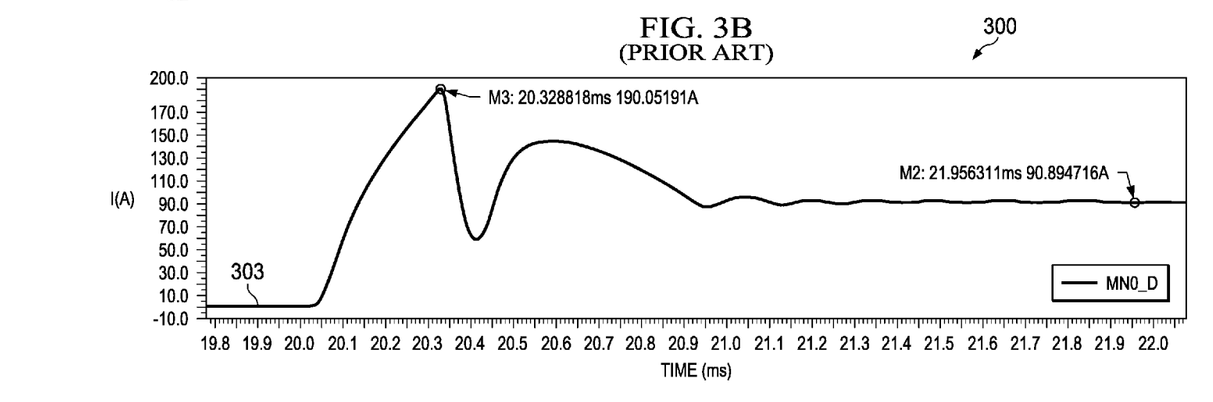

FIGS. 3A and 3B illustrate in a voltage graph and a current graph the voltage input and the corresponding current of a FET circuit such as circuit 100 in a turn on operation. The horizontal axis of FIGS. 3A and 3B illustrate time in milliseconds. The vertical axis of FIG. 3A illustrates a rising voltage on the input terminal EN in data line 301. At time 20.0 the enable terminal receives a rising voltage of 3.4 Volts. Data line 303 illustrates current flowing through the FET MN0 on the vertical axis of FIG. 3B. In this example the current limit is arranged to be at 90 Amperes. As can be seen in the data line 303 in FIG. 3B, the current overshoots the specified current limit at time M3: 20.3, rising to a maximum current of above 190 Amperes, a level that is 100 Amperes above the desired current limit of 90 Amperes. At time M2: 21.95, the current settles at 90.89 Amperes, approximately at the limit of 90 Amperes. The current overshoot is caused because even though the current limiting circuitry reduces the gate signal when the limit (here, 90 Amperes) is reached, the time it takes to discharge the gate capacitance and reduce the current flow in the FET allows the current overshoot to occur until the power FET MN0 can operate at a reduced current.

Figure 4:
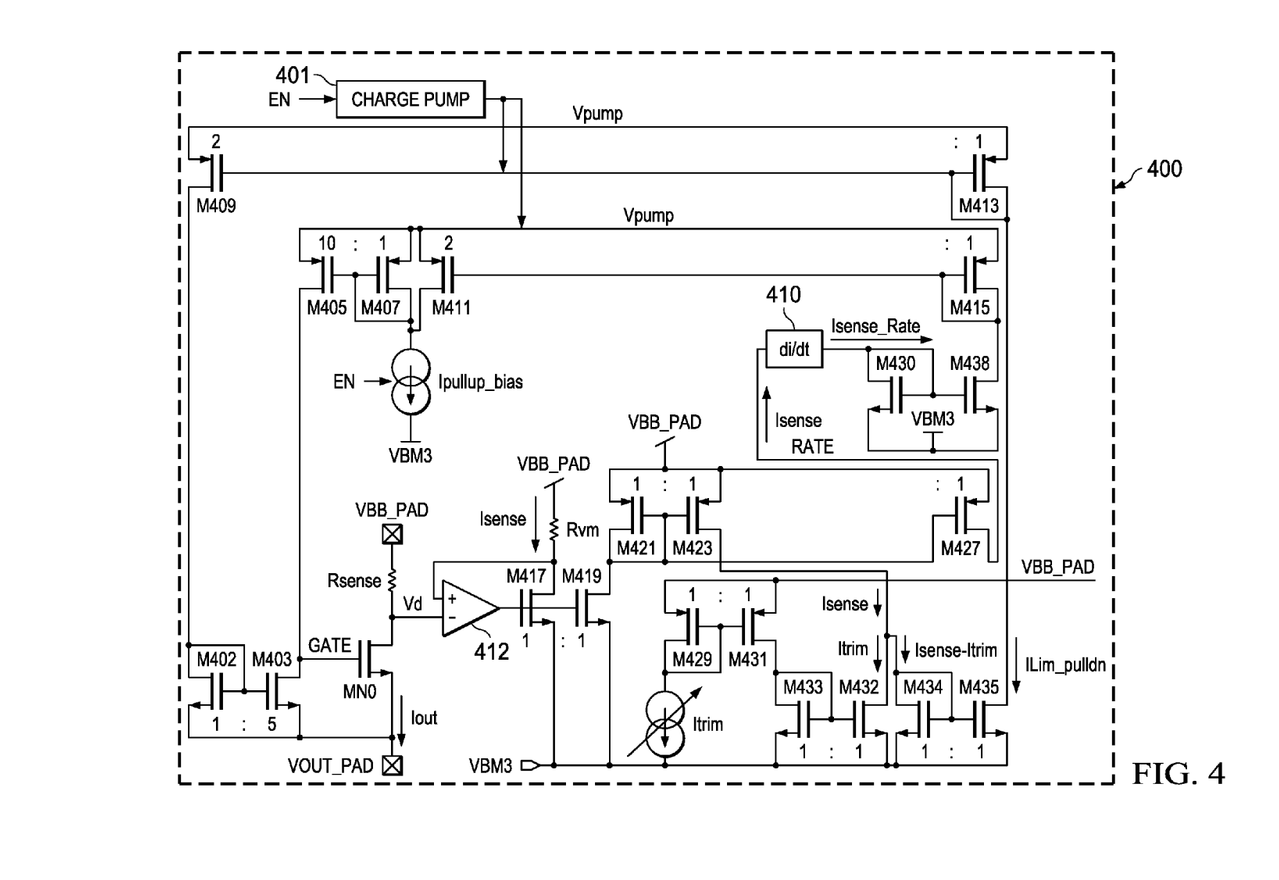
FIG. 4 illustrates in a circuit diagram a power FET embodiment in a high side driver configuration.

FIG. 4 illustrates in a circuit diagram an example embodiment power FET circuit 400. In FIG. 4 a high side driver arrangement is shown. Power FET MN0 is coupled to supply current and voltage to a load at the output terminal VOUT_PAD. Power FETs with high voltage and high current handling capabilities and having very low on resistance (RDSon) include NexFET™ MOSFET devices currently available from Texas Instruments Incorporated. NexFET™ devices are a type of vertical FET that have a drain contact at a bottom surface of a semiconductor substrate and a source contact on the upper surface of the substrate, and which feature a shared drain region that can be shared by many channel regions, including one or more parallel MOSFET devices formed in the substrate. However, the embodiments are not limited to any one power transistor type or any semiconductor technology type, and the various embodiments are applicable to any power FET device.

In FIG. 4, the circuit outputs output current Iout. A supply voltage such as a battery voltage can be coupled to an input terminal VBB_PAD. The voltage from a charge pump circuit 401 Vpump is coupled to various components. This supply voltage Vpump is increased above the voltage at the input terminal VBB_PAD. In FIG. 4, all of the components can be implemented on a single integrated circuit, as indicated by the dashed line at the border of 400. However, in alternative arrangements, some of the components can be implemented as discrete components while other components are arranged on one or more integrated circuits. In one example, the power FET MN0 and the sense resistor Rsense were fabricated on a power FET integrated circuit; while the remaining components were fabricated on a separate driver integrated circuit. These separate integrated circuits can be packaged individually and mounted on a circuit board, or module. In alternative arrangements, advanced packaging techniques such as multi-chip modules (MCMs) or stacked die packages can be utilized to form a single package for the system 400 even when the components are implemented on separate integrated circuits or on separate integrated circuit dies. Power FETs for use with the embodiments include but are not limited to: NexFET™ devices, vertical FET devices appropriate for power applications, DMOS power FETs and LDMOS power FETs. The embodiments are applicable to any FET device.

In FIG. 4, the gate terminal GATE of power FET MN0 has several circuits coupled to it. These circuits supply and modulate the power FET gate current and voltage. These circuits make up gate driver circuitry. The terminal GATE receives pull up bias current from transistor M405, which is a P-FET transistor that is part of a current mirror formed with transistor M407, and which is biased by the current source "Ipullup_bias."

Current source Ipullup_bias provides the current used to pull up the gate terminal GATE to the voltage supply Vpump in response to an enable signal EN. When a signal is received on the enable terminal EN, the charge pump 401 and the pullup bias current source Ipullup_bias become active. Transistors M405 and M407 also provide current scaling, here shown as 10:1, to increase the current supplied to the GATE terminal of the FET MN0 from the charge pump voltage Vpump by 10 times the current Ipullup_bias. By using different sized transistors in the current mirrors, the various transistors can provide current scaling. The scaling feature allows smaller bias and reference current sources to be used. Other scaling factors can be used to form additional embodiments. The scaling factors in FIG. 4 are indicated by two integers spaced by a colon such as: 1:1, 2:1, 1:5, 10:1.

In addition, the gate terminal GATE of the power FET MN0 is coupled by transistor M403 and transistor M402, which form a current mirror, to the voltage Vpump by transistor M409. Transistor M413 forms a current mirror with M409 and mirrors a pull down current labeled "Ilim_pulldn" to the gate terminal GATE.

A current sensing circuit is included in FIG. 4. A sense resistor Rsense is coupled between the pad VBB_PAD for coupling a battery supply voltage and the drain terminal of power FET MN0. The FET drain voltage Vd is coupled to an operational amplifier 412 in a voltage to current converter. The operational amplifier and transistor M417, along with resistor Rvm, form the voltage to current converter circuit. Because the operational amplifier 412 is arranged in a feedback configuration with a virtual ground between the negative and positive inputs, the circuit modulates the output voltage to minimize the difference between the positive and negative inputs, and the voltage at the gate terminal of transistor M417 will be increased or decreased with the voltage Vd. The current Isense flowing through resistor Rvm will be proportional to the output current Iout, providing a current sensing function.

The sensed current Isense is used to control the operation of the power FET by comparing Isense to several other reference current levels. Transistor M419 couples Isense to a current mirror formed by transistors M421 and M423, and then to a comparator formed using transistors M432, M433 and M434. A current source labeled "Itrim" is supplied to the comparator by a current mirror formed of transistor M429 and M431. The trim current Itrim can be fixed or adjustable, for example Itrim can be provided by a digital to analog converter (DAC) with a digital control word to set the current for Itrim. Additional arrangements include trimmable current sources or fixed current sources to provide the current Itrim. A programmable current source using a writeable register to selectively couple parallel current sources to M429 can be used to for the trimmable current source Itrim. In another embodiment, the current source Itrim can be set by the use of a digital bus interface such as an I2C bus, and a settable register value. By writing values to the register a system controller or CPU can change the value of the current Itrim. In other embodiments, the value can be set at manufacture time using trim resistors. In still other embodiments, the value for the current source Itrim can be fixed. The comparator formed by transistors M433, M432 is coupled to a current mirror formed from transistors M434 and M435.

In operation, when the current Isense is greater than the trim current Itrim, the comparator outputs a pull down current ILim_pulldn. This pull down current is mirrored by the P type FET devices M413, M409 to the gate of the FET transistor MN0, and with mirror formed by transistors M402, M403, is used to reduce the current flowing into the gate terminal GATE of the power FET MN0, and thereby controls the output current Iout. When the current limit set by the value for Itrim is reached, the pull down current can be used to keep the output current Tout at the desired current limit. Note that various transistor and current mirror devices in the example embodiment 400 have device scaling used to increase the currents. For example, the current mirror formed from M402, M403 has a 5:1 size ratio which increases the pull down current at the gate of FET MN0. Similarly, the current mirror formed by transistors M413, M409 has a 2:1 ratio. These scaling factors can be modified to form alternative embodiments as needed for a particular application. Use of transistor scaling allows the sense current Isense to be lower than the output current Tout, saving power in the driver control circuitry.

When the circuit 400 is to be turned on, an enable signal EN is received and turns on the charge pump 401, outputting the power supply voltage Vpump. The pull up current Ipullup_bias is supplied through the current mirror formed by transistors M407, M405 to the gate of the FET MN0. Note in this example embodiment, transistors M405, M407 provide a 10:1 scaling to increase the pull up current at the gate terminal GATE of FET MN0. When the FET is initially turned off, the gate capacitor between the gate and source terminals Cgs is fully discharged. As the voltage Vpump and the pullup current from the bias current source Ipullup bias is supplied into the gate of the FET, the source of FET MN0 follows the increasing voltage at the gate in a source follower configuration until the gate capacitance Cgs of the power FET MN0 is charged, the gate terminal GATE exceeds a threshold voltage for the power FET MN0, and the FET MN0 turns on. The rise time of the gate terminal GATE of the FET MN0 is set by the bias current Ipullup_bias. This pull up bias current value can be fixed prior to manufacture, after manufacture, and can be made adjustable or trimmable.

Once the FET MN0 turns on, the gate current and voltage can be used to control the current Tout. The FET MN0 is operated in the linear mode for most situations. Although not shown for clarity of the illustrations, additional circuitry for pulling the gate terminal GATE down in a FET turn off situation can be used to discharge the gate rapidly using transistors M402, M403 along with additional control circuitry to couple the gate to VOUT_PAD.

In an operation supplying current to a load at the terminal VOUT_PAD, the resistors Rsense and Rvm operate in a ratio to form current Isense that is less than, but proportional to, the output current Tout, according to Equations 1 and 2:

$$Rsense*Tout=Isense*Rvm \quad (1)$$

$$Isense=Iout*(Rsense/Rvm) \quad (2)$$

When the sensed current Isense is greater than or equal to the adjustable current Itrim, a current comparator formed of transistors M432, M433, M434, M435 will begin to output the pull down current Ilim_pulldn. The comparator circuits form the difference (Isense-Itrim) as shown in FIG. 4, which is mirrored to become ILim_pulldn. The relationship of the output current Tout to the trim and pull down currents when the current limit is reached is given by Equation 3:

$$Iout(limit)=(Rvm/Rsense)*(Itrim+Ilim\_pulldn) \quad (3)$$

By arranging the value of the trim current Itrim, the current limit for the output current Tout can be controlled and set. Note that the sizes of transistors in the circuitry can be modified to ratio various currents in the circuit. For example, transistor M413 and M409 have a two to one ratio, while transistor M403 and M402 have a five to one ratio, so that the output current Tout can be much larger than the other currents in the circuit.

In addition to the current limiting circuitry, the embodiment in FIG. 4 also features a current time derivative control circuit 410. In the embodiments, the power FET MN0 can have reduced or eliminated current overshoot during a current limited operation. The output current overshoot that is observed in conventional current limiting circuitry is eliminated or greatly reduced by use of the embodiments. This is achieved by first detecting a rapid rate increase in the sensed current prior to the current flowing in the power FET reaching the current limit, and by reducing the rate of the output current increase. As the output current Tout reaches the current limit, the rate of increase in the output current is reduced. The reduction in current rate increase as the current limit is approached allows the output current to settle at the current limit, but either with no overshoot or without significant overshoot. That is, by sensing the rate of increase in the output current and by modulating the rate of current increase through the power FET even as the current limit is approached, the output current can safely reach the current limit and settle at the current limit without the large current overshoots of conventional current limit circuitry. In this manner, the FET can be operated within the SOA conditions, protecting the FET from damage or reduced lifetime.

In FIG. 4, the current time derivative or "di/dt" function 410 receives the sense current Isense from a current mirror including transistor M421 and transistor M427. The current time derivative function 410 determines the rate of increase of the sense current Isense, which is proportional to the rate of increase of the output current Tout. A current mirror formed with transistors M430, M438 couples an output current Isense_Rate to the pull up bias current circuitry using transistors M415, M411. The current Isense_Rate flows through M438 to ground and reduces the pullup current Ipullup_bias flowing into the GATE terminal of the power FET MN0.

In operation, when the rate of increase of the sensed current Isense exceeds a threshold, the current time derivative circuit 410 will output current Isense_Rate and cause the pull up current supplied to the gate of FET MN0 to be reduced. Reducing the current supplied to the gate of FET MN0 reduces the slew rate of the FET gate terminal GATE, and slows down the rate of increase of the output current Tout. Once the current limit is reached, the rate of change of the output current will again fall (as the current Tout is fixed at the current limit and no longer increasing) and the current time derivative circuit 410 will no longer output Isense_rate, no longer affecting the output current. The current time derivative circuit 410 will not detect any increase in the sensed current rate once the output current Tout is fixed or is approximately fixed at the limit current.

The current time derivative circuit 410 can be implemented utilizing a variety of circuits that are useful for current-time or di/dt sensing. Resistive capacitive sensing using a current to voltage conversion of Isense, along with a capacitor that is then periodically sampled, can be used. Hall effect sensors, coils, current loops and other field sensing approaches can be used. The current rate threshold can be fixed, programmable, or can be a one-time programmable value programmed during a calibration operation after manufacture is complete. Trimmable resistors can be used to set the current rate threshold. A register accessible by a controller or processor over a bus, such as an I2C interface bus, can provide a programmable value for the current increase rate threshold.

In the embodiment shown in FIG. 4, the current time derivative circuit 410 is always active. While this arrangement provides the desired reduced overshoot in the output current Iout, the current time derivative circuit 410 will also reduce the slew rate of FET MN0 throughout the rise time, and thus the FET turn on time will be increased. In some applications this effect can be undesirable, as it may limit inrush current to a load in an initial power up operation, or it may slow system start up.

Figure 5:
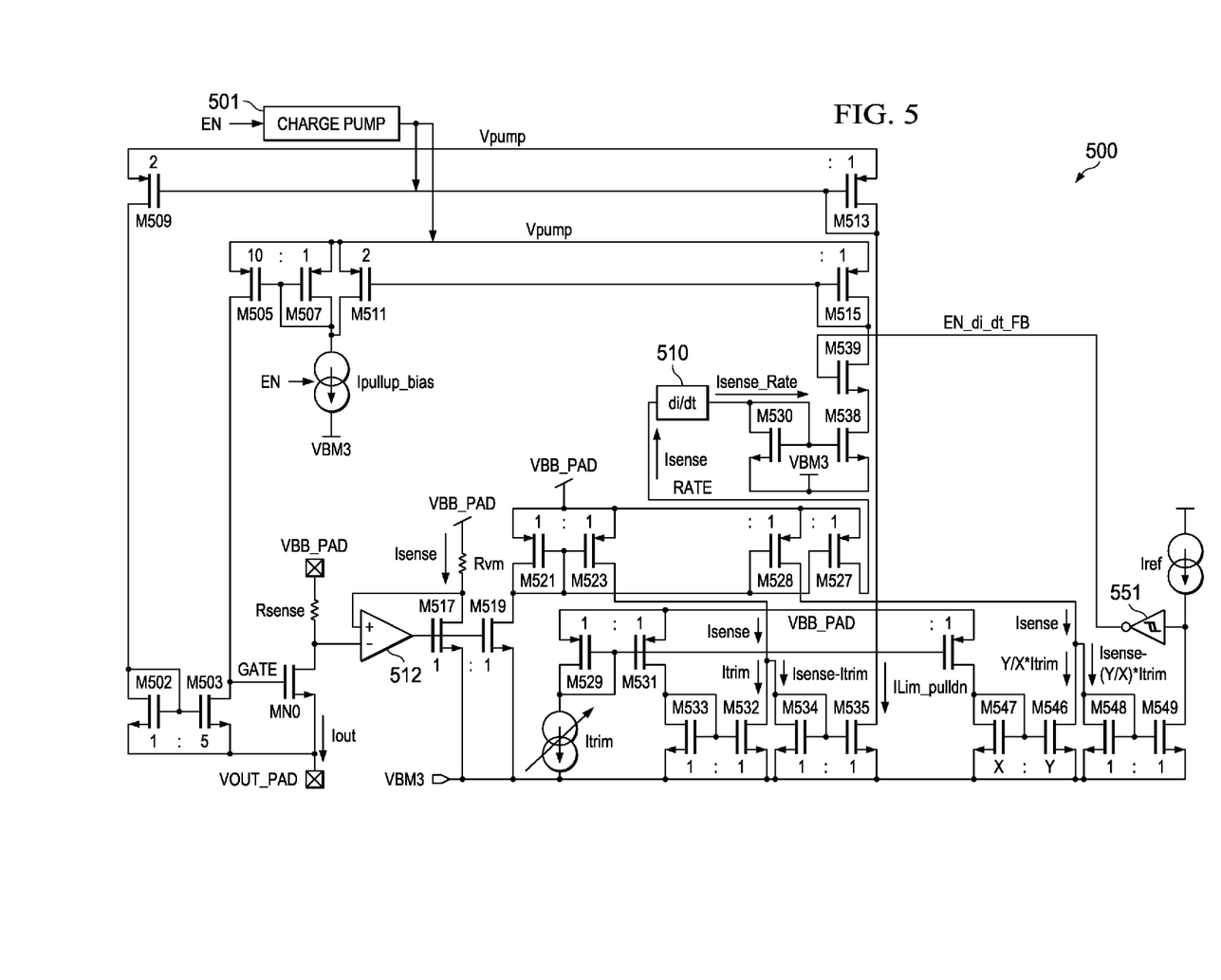
FIG. 5 illustrates in another circuit diagram an additional power FET embodiment.

FIG. 5 depicts a circuit diagram for an alternative embodiment 500. In FIG. 5, many of the components are similar to and function in the same manner as for the embodiment of FIG. 4. For these components, the reference labels are similar to those shown in FIG. 4, but with the leading numerals changed from "4" to "5", for convenience.

In FIG. 5, power FET MN0 is coupled between a supply voltage at a power pad VBB_PAD and an output terminal VOUT_PAD. The power FET MN0 has supply and bias circuitry couple to a gate terminal GATE to provide gate current to control turning on and turning off the power FET MN0 in the same manner as described above with respect to FIG. 4. The charge pump 501 outputs a supply voltage Vpump when it receives an enable signal EN. The pullup bias current supply Ipullup_bias is also enabled by signal EN.

In addition to the current sense circuitry including the op amp 512 arranged and operating as described above with respect to FIG. 4, in FIG. 5, the time derivative circuit 510 is coupled to the pull up bias circuitry and the pull up current source Ipullup_bias by an enable switch, transistor M539. An additional enabling circuit is provided that outputs the control signal EN_di_dt_FB. This control signal is used to cause switch M539 to couple the Isense_Rate output of the current time derivative circuit 510, which is a di/dt sensing circuit, to the pull up bias supply circuit of transistors M505, M507 only when the current Isense (and correspondingly, Iout) has increased to a selected percentage of the current limit while it is approaching the current limit.

In FIG. 5, a comparator circuit is formed by the reference current Iref, the transistors M546, M547, M548, M549, the limit current Itrim, and the sensed current Isense. Transistor M528 mirrors the sensed current Isense to a comparator including a current mirror formed by transistors M547, M546. The trim current Itrim is mirrored and scaled by the respective sizes of transistors M547 and M546 as indicated by the scaling factors "X" and "Y" shown in FIG. 5. This scaled trim current is subtracted from the sensed current Isense. This difference current is then mirrored by transistors M548 and M549 to the input terminal of the Schmitt trigger device 551, where it is compared to a reference current Iref. When the difference current between Isense and the scaled product of (Y/X)*Itrim is greater than Iref, the input to the Schmitt trigger 551 falls, and the output EN_di_dt_FB goes high, as the Schmitt trigger 551 is an inverter. The Schmitt trigger device 551 outputs a pulse only when the difference between the sense current Isense and the scaled trim current (Y/X)*Itrim is greater than or equal to Iref.

The enable signal EN_di_dt_FB will go high when the inequality of Equation 4 is met:

$$Isense-(Y/X)*Itrim >= Iref \quad (4)$$

The enable signal EN_di_dt_FB output from the Schmitt trigger 551 is coupled to the transistor M539. Transistor M539 operates to selectively couple the output of the current time derivative circuit 510, the current Isense_rate, to the pull up bias circuitry. In this manner the output of the current time derivative circuit 510 is only used for that portion of the rise time of the FET MN0 gate terminal GATE when the difference between the sensed current Isense and the scaled trim current (Y/X)*Itrim meets or exceeds the reference current Iref. For operations where the sensed current does not rise to this threshold, the time derivative circuit 510 does not affect the current of the power FET MN0. In a case where the output current is rising and the difference between the sensed current Isense and the scaled trim current (Y/X)*Itrim does equal or exceed the reference current Iref, the time derivative circuit 510 is coupled to the pull up bias circuitry. The current Isense_rate then reduces the rate of increase in the current Iout as the current rises towards the current limit.

The enable signal EN_di_dt_Fb can be adjusted to become active at a predetermined percentage of the current limit. As described above, the current limit is set by adjusting the current source Itrim and the percentage of the current limit for enabling the current time derivative circuit can be set using the transistor scaling ratio Y:X by selecting the relative sizes of the transistors M546, M547. In addition, in alternative arrangements the scaling can be accomplished by providing a writeable storage circuit such as addressable register coupled to a DAC circuit. An interface to an external processor such as an I2C serial interface can be arranged to allow the scaling factor to be stored. Further the operation of the enable signal can be adjusted by adjusting the current sources Iref, and Itrim.

Figure 6A:
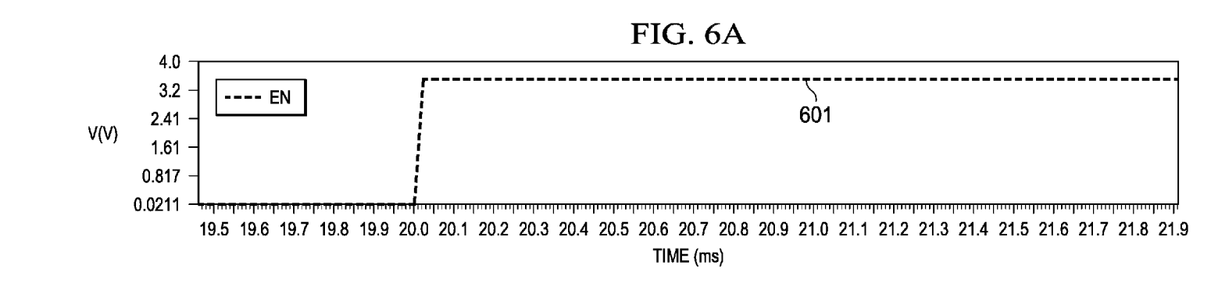
FIGS. 6A-6D are graphs depicting an input voltage and output currents for example power FET circuits.

FIGS. 6A-6D depict in four graphs the operation of example embodiments such as are shown in FIG. 4 and FIG. 5. In all of the graphs FIG. 6A-6D, the horizontal axis plots time in milliseconds. In FIG. 6A, the enable signal voltage EN is plotted on the vertical axis. Data line 601 plots voltage at the enable terminal. At time 20.0 milliseconds, enable signal EN rises from an approximately zero voltage to a voltage sufficient to cause the pull up bias circuits and the charge pump to turn on the power FET in the above circuit embodiments of FIGS. 4 and 5.

Figure 6B:
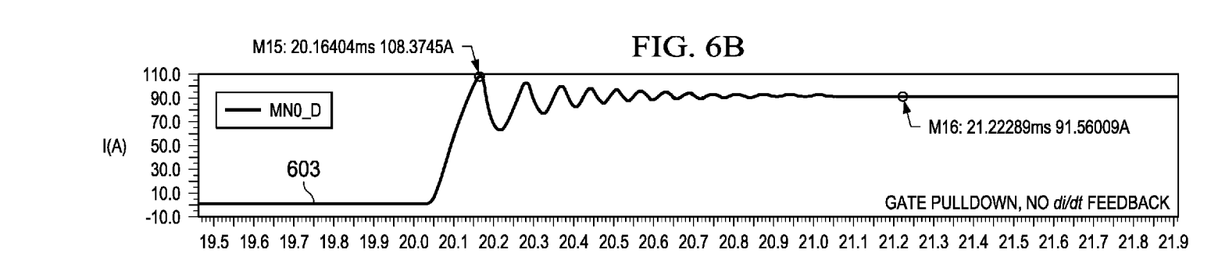
Figure 6C:
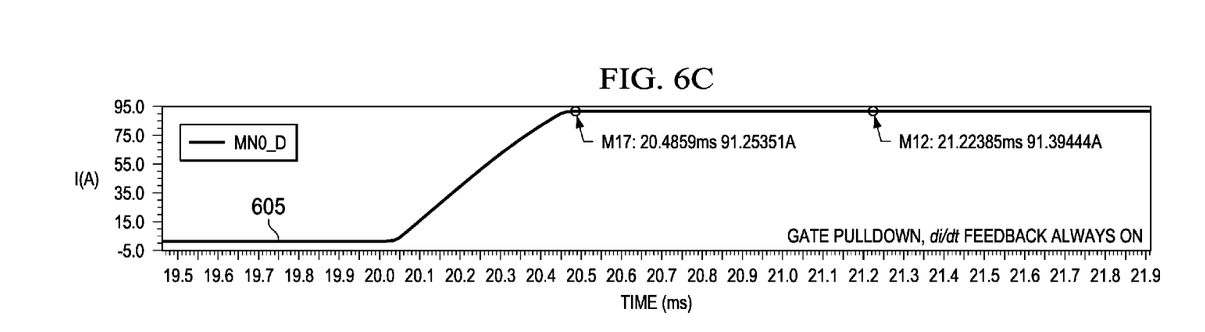
Figure 6D:
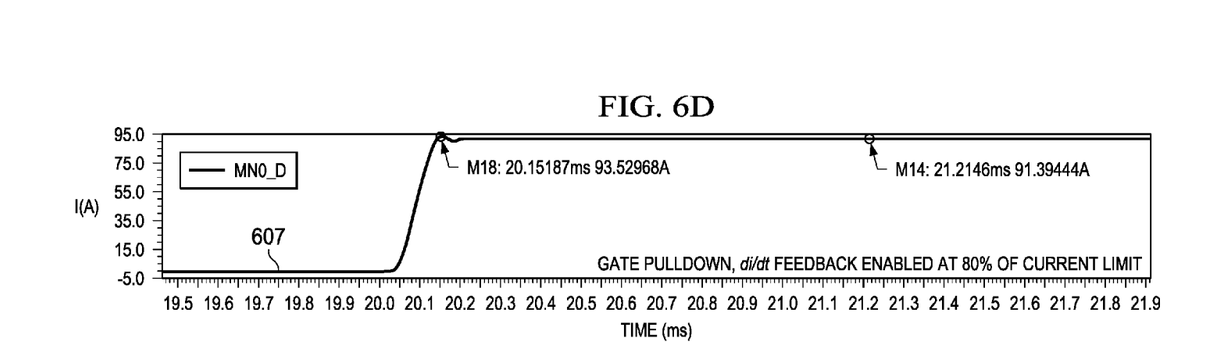

In FIGS. 6B-6D, current through the power FET is plotted on the vertical axis in amperes (A). Data line 603 in FIG. 6B illustrates the FET drain current response of a power FET with a pull down limit current circuit such as shown in FIGS. 4 and 5, but without the current time derivative circuitry being enabled. In FIG. 6B, at timeM15: 20.16404, an overshoot is seen in the response in data line 603 with the current rising to over 108 Amperes. An oscillation continues to overshoot the desired current limit of about 90 Amperes for several cycles until the oscillation dies away at time 21.0, the current Iout finally settles at time M16 21.22289 at about 91 Amperes, near the desired current limit of 90 Amperes.

In FIG. 6B, the output current Iout is shown for the embodiment of FIG. 4 with the current time derivative circuit 410 always operating. Data line 605 represents the drain current of the power FET. At time 20.05, the output current begins rising in response to the enable signal, but the rate of increase (slope) is limited by the current time derivative circuit, so that the final current at the limit of 91.39 Amperes, which is just above the limit of about 90 Amperes, is reached at about time M17: 20.485. Note that in contrast to data line 603 in FIG. 6A, there is no visible overshoot in the current output data line 605 in FIG. 6B. The current time derivative or di/dt circuit has eliminated the current overshoot, however the rise time for the output current through the power FET has also been substantially increased.

In FIG. 6D, data line 607 indicates the drain current for the embodiment of FIG. 5, where the current time derivative circuit is enabled only after the sensed current reaches a percentage threshold of the current limit value. The threshold can be a percentage of the maximum current or limit current, such as 80%. In alternatives, other percentage thresholds can be utilized. In FIG. 6D, the current quickly starting at time 20.05 and by time 20.5 the current has reached a maximum current limit of about 90 Amperes. In data line 605, at time M18: 20.15187 a slight overshoot is seen to about 93 Amperes, but this overshoot immediately settles out to near the desired limit of 90 Amperes, settling at 91.39 Amperes, the same settling current as for the embodiment of FIG. 4, plotted in FIG. 6C. The turn on time for the power FET is much shorter in the plot of FIG. 6D. Depending on the requirements of a particular application, the appropriate embodiment of FIGS. 4 and 5 can be utilized. The current limit, the percentage threshold, and the current rate increase threshold can all be modified to form additional embodiments as appropriate for a particular design requirement.

Figure 7:
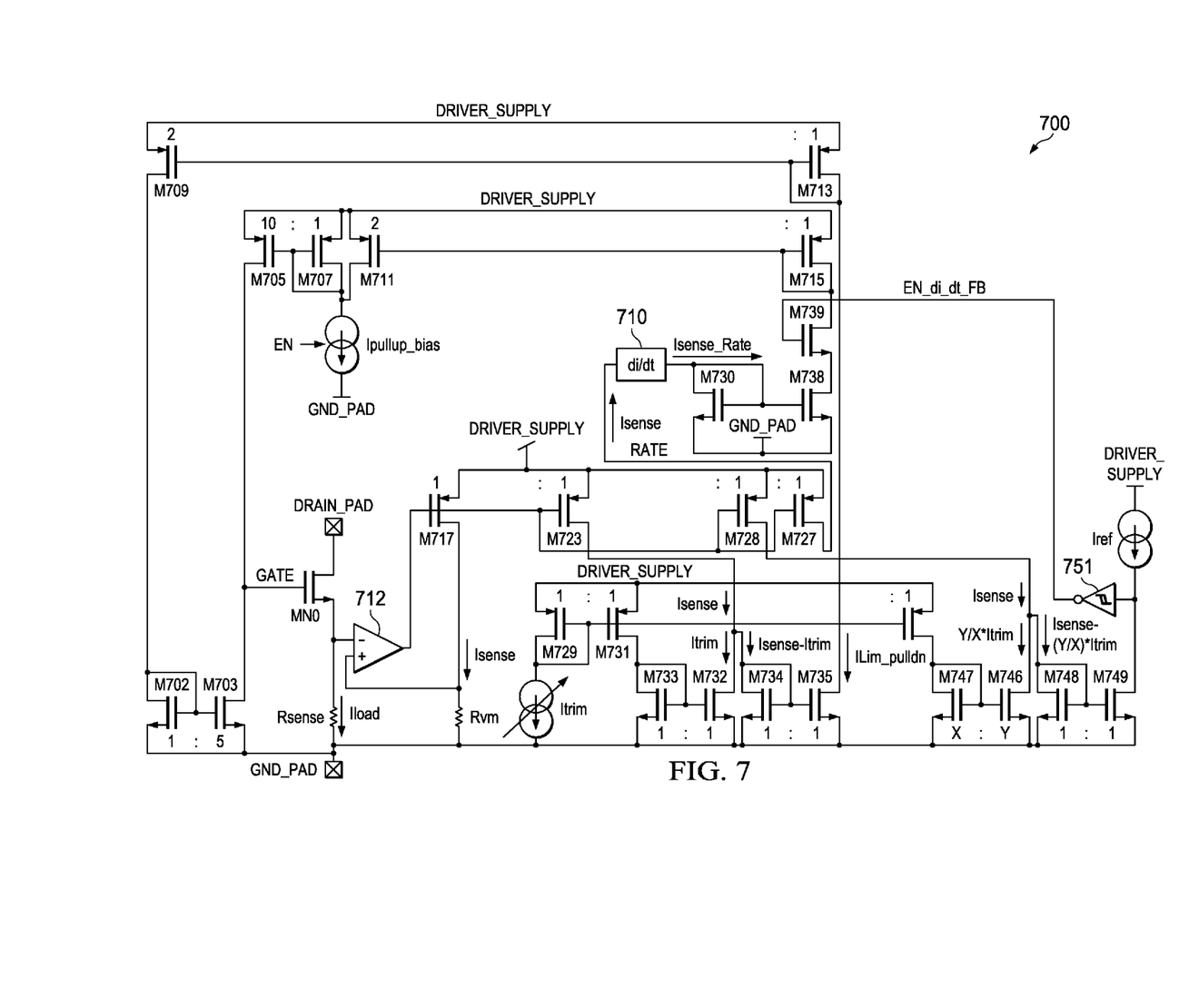
FIG. 7 is a circuit diagram illustrating a power FET embodiment in a low side driver configuration.

FIG. 7 depicts in another circuit diagram an embodiment for a low side driver application. In FIG. 7, elements that correspond to similar elements in FIGS. 4 and 5 are given similar reference numerals, except that the first digit of the reference numeral is now a "7". Circuit 700 can be implemented as a single integrated circuit, using discrete components, on a circuit board or module, using a multi-chip module, or using multiple dies in a single package to form a highly integrated device. In one arrangement, the power FET MN0 and the sense resistor Rsense may be formed in a single integrated circuit, while the remaining devices are formed in a second, separate integrated circuit to provide a driver IC for the FET. Other combinations of the devices in single or in multiple integrated circuits are also possible.

In FIG. 7, the power FET MN0 has a drain terminal coupled to an input pad labeled "DRAIN_PAD". In an application this terminal can be coupled to one end of a load. The power FET MN0 has its current conduction path, from drain to source, coupled between the load and a ground potential at the pad "GND_PAD", that is, FIG. 7 illustrates a low side driver arrangement. The supply voltage for the various voltage and current supplies to the gate of the power FET MN0 is labeled "DRIVER_SUPPLY." As was described with respect to FIG. 2 above, for a low side driver configuration, the gate of the FET MN0 does not require a boosted voltage to turn on the FET. A load (not shown in FIG. 7) can be coupled between a power supply and the drain of the FET MN0 at the input DRAIN_PAD. The FET MN0 will allow current to flow through the load and to ground in response to the enable signal EN.

The current limiting circuitry in FIG. 7 is similar to and operates in the same fashion as that shown in FIG. 5 for the high side driver arrangement. In FIG. 7, the enable signal EN will turn on the bias current source Ipullup_bias. The current mirror formed of transistors M707 and M705 will supply this bias current to the gate of the power FET MN0. The transistors M705, M707 are arranged to scale the bias current by a 10:1 factor, so that the current at the transistor gate terminal GATE is larger than the current source Ipullup_bias. The voltage at the terminal DRIVER_SUPPLY is also coupled to the gate terminal labeled GATE.

When the drain to source current is flowing in the power FET MN0, a voltage proportional to the FET current appears across the sense resistor Rsense. The operational amplifier, transistor M717, and resistor Rvm are arranged to output a sense current that is proportional to the load current Iload. The resistor ratio and operation of the current sense circuit are the same as described above with respect to FIG. 4. The sense current Isense is compared to trimmable current source Itrim by a comparator that is formed by the transistors M729, M731, M733, M732, M734 and M735, and the difference current ILim_pulldn that is output is then used to control the current into the gate terminal GATE after the current limit is reached. The current ILim_pulldn is the difference between the current Isense and the trimmable current Itrim, and can be set by changing the value of the trimmable current source Itrim. Transistors M713, M709 and M702, M703 form two current mirrors that couple the limit current to pull down from the GATE terminal. Scaling of the transistors is used so that the current at the gate of the transistor MN0 from transistor M703 is larger than the current ILim_pulldn. By using transistor scaling, smaller current sources such as Itrim can be used to save power and area.

The embodiment of FIG. 7 also includes the current time derivative circuitry to reduce the rate of increase in the current through the power FET as it rises towards the current limit, and to prevent overshoot current, as described above with respect to FIG. 5. The comparator circuitry formed by the transistors M747, M746, M748, M749 and the reference current Iref will cause the Schmitt trigger 751 to output an enable signal EN_di_dt_FB to the enable switch M739 when the sensed current minus the trim current Itrim multiplied by the transistor scaling ratio Y/X is greater than the reference current Iref. By setting the reference current Iref and the scaling factor Y/X, a percentage of the limit current can be set as a threshold, for example 80%. Only after the sensed current Isense reaches this threshold is the current time derivative circuit 710 coupled to reduce the current to the gate of the power FET MN0.

The current time derivative circuit 710 outputs a current Isense_Rate that is coupled to reduce the pull_up bias current that is input to the gate terminal GATE. Isense_rate is output when the di/dt circuit 710 detects a rise in the sensed current Isense that is greater than a threshold. In this manner, the rate of increase of the current through the FET MN0 is controlled until the current limit is reached, preventing overshoot. The current sources Iref, Itrim, Ipullup_bias, and the scaling factors X and Y can be fixed or adjustable. Programmable current sources formed using DAC circuits and writeable registers can be used. Nonvolatile storage registers can be programmed at manufacture or during use. An interface bus such as an I2C interface can be used to write the programmable registers. Trimmable resistors or fuses can also be used.

Figure 8:
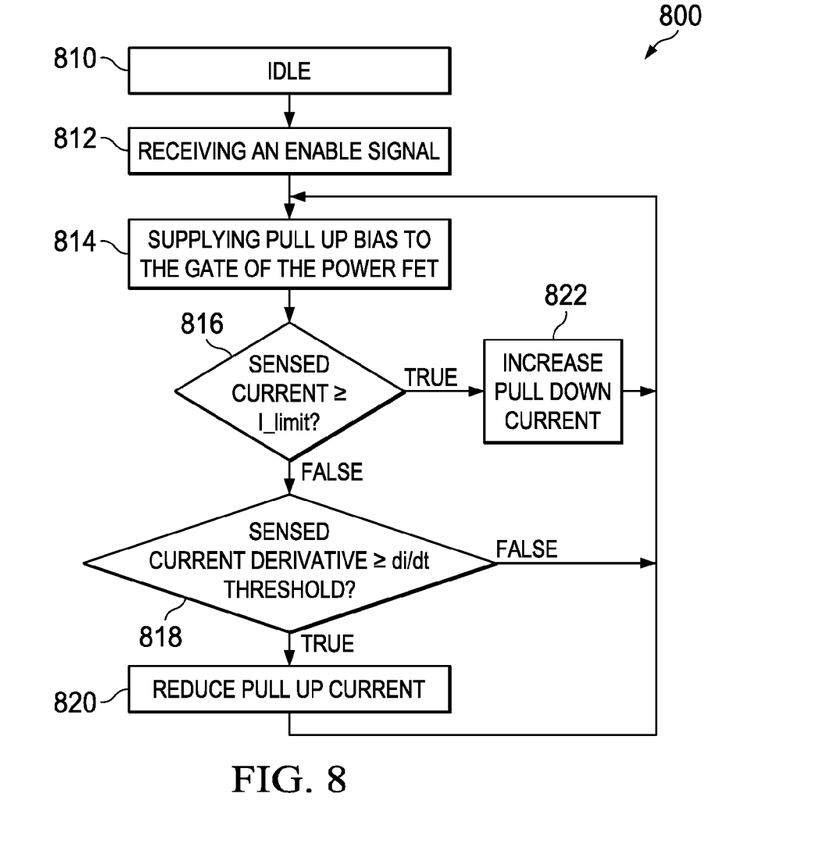
FIG. 8 is a flow diagram illustrating a method embodiment.

FIG. 8 depicts in a flow diagram 800 an example method embodiment. In the method illustrated in FIG. 8, a time derivative current circuit or di/dt circuit is always active. In FIG. 8, the method begins at step 810, Idle. At step 812 an enable signal is received. The method then transitions to step 814 and a voltage and bias current is coupled to the gate terminal of the power FET. The power FET begins turning on in response to the bias current. After sufficient current is input to the gate terminal to charge the gate capacitance, the power FET enters the linear mode of operation.

At step 816, the current flowing through the power FET is sensed. The sensed current is compared to a current limit. If the comparison at step 816 is true, the method transitions to step 822. If the comparison at step 816 is false, the method transitions to step 818.

At step 818, the time derivative of the sensed current, or di/dt, is compared to a threshold. If the rate of increase of the sensed current is greater than a threshold, then the method transitions to step 820. If the comparison is false, the method transitions back to step 814 and the method continues.

At step 820, since the comparison at step 818 was true, the rate of increase in the current flowing through the power FET is reduced. This can be done by reducing the pull up bias current as described above. The method then transitions back to step 814 and continues.

Step 822 is entered when the comparison at step 816 is true, that is when the current limit has been reached. At step 822, the current flowing through the power FET is limited by pulling current down from the gate terminal to the Vout terminal. By discharging the gate capacitance, the power FET will have a reduced gate voltage, and a reduced current flowing through the power FET. The method will continue operating with the current limited to the maximum limit.

Note that once the sensed current reaches the maximum limit, the rate of increase in the current di/dt will become zero, so that when the current is limited by the pull down current, the comparison at step 818 will always be false.

The method steps shown in FIG. 8 illustrate one possible order of steps. However, the order of steps can be modified to form an alternative embodiment. For example, the comparisons at steps 816, 818 can be done in a different order or can be done simultaneously instead of in the order shown in FIG. 8. These modifications form additional embodiments that are within the scope of the appended claims.

Figure 9:
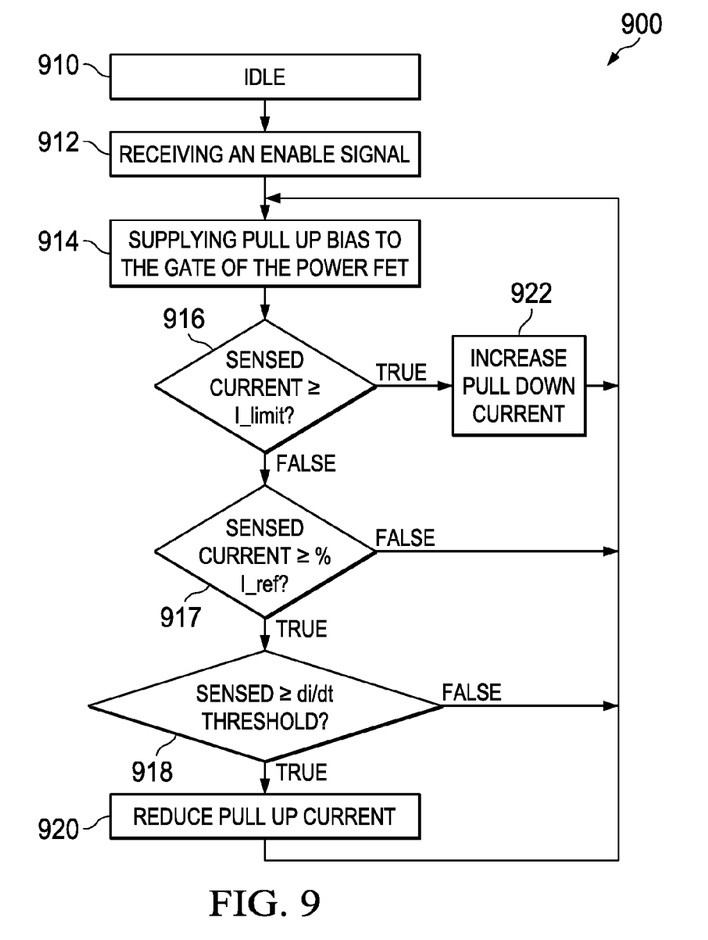
FIG. 9 is another flow diagram illustrating a method embodiment.

FIG. 9 depicts in another flow diagram an alternative method. In FIG. 9, the method 900 includes selectively enabling a current time derivative function. At step 910, the method begins in an Idle step. At step 912, an enable signal is received. At step 914, power is supplied to a power FET and a voltage and a bias current are applied to the gate terminal of the power FET, pulling up the gate terminal and turning on the power FET.

At step 916, a current sensor senses the current flowing through the power FET. If the sensed current exceeds a current limit, the method transitions to step 922. If the comparison is false, the method continues to step 917.

At step 917, the sensed current is compared to a reference current. The reference current can be adjusted or set to a current that is a percentage of the current limit, for example, in one experiment the reference current was set to about 80% of the current limit.

If the comparison as step 917, the method transitions to step 918. At step 918, the rate of increase in the sensed current is compared to a threshold in a current time derivative operation. If the rate of change in the sensed current is increasing at a rate in excess of a threshold, the method transitions to step 920. At step 920, the pull up current is reduced, reducing the rate of increase in the current flowing in the power FET. The method then continues to step 914 and continues.

If the comparison at step 918 is false, the method transitions to step 914 and continues. If the comparison at step 916 is true, the current limit has been reached, and the method transitions to step 922. At step 922, a pull down current is increased and the current flowing through the power FET is reduced to maintain the output current at an output terminal limited to a maximum current.

The method steps shown in FIG. 9 illustrate one possible order of steps. However, the order of steps can be modified to form alternative embodiments. For example, the comparisons at steps 916 and 917 can be done in a different order or simultaneously instead of in the order shown in FIG. 9. These modifications are within the scope of the appended claims.

Example embodiments and arrangements form power FET circuits with continuously limited current. In described examples, current sense circuitry coupled to a FET device supplies a sense current corresponding to the current flowing through the FET. The sense current is coupled to a comparator. A predetermined limit current is compared to the sense current. A pull down current is applied to limit the current flowing through the FET when the comparator indicates the predetermined limit current has been reached. The sense current is also supplied to a current time derivative circuit. The rate of increase in the sense current is compared to a threshold rate. When the rate of increase in the sense current exceeds the threshold rate, a bias current to the FET is reduced to reduce the rate of increase in the output current.

In a further example, an enable circuit is coupled between the current time derivative circuit and a bias current supply, and a current rate comparator circuit is coupled to the sense current and a reference current, and outputs an enable signal to the enable circuit.

In an additional example, an output is coupled from a current limit comparator to enable the pull down current circuit.

In at least one alternative example, the apparatus further includes circuitry to reduce the bias current to the gate terminal of the FET responsive to the sense rate current.

In another example, the apparatus includes a programmable predetermined limit current. In a further example, the predetermined limit current is stored in a writable storage circuit. In a further example, the current time derivative circuit includes a rate detection circuit for outputting the sense rate current when the increase rate of the sensed current exceeds a predetermined threshold.

In a further example, the apparatus further includes an enable circuit coupled between the sense rate current and the bias current supply; and a current rate comparator circuit coupled to the sense current and to a reference current, and outputting an enable signal to the enable circuit. In still another example, the current rate comparator circuit includes a scaling factor and the current rate comparator circuit compares a difference between the sense current and a multiple of the scaling factor and the predetermined limit current to the reference current.

In another example, the scaling factor is programmable. In another additional example, a programmable storage circuit stored the scaling factor. In still another example, an external bus interface is coupled to address the programmable storage circuit.

An example method includes: receiving an enable signal; coupling a current conduction path of a FET between a supply voltage terminal and an output terminal for supplying current; coupling a voltage and a pull up bias current to a gate terminal of the FET; sensing current flowing through the FET; comparing the sensed current flowing through the FET to a current limit; reducing the current at the gate terminal of the FET, responsive to comparing the current flowing through the FET. The method further includes comparing a rate of increase of current flowing through the FET to a rate increase threshold; and reducing the pull up current to the gate terminal of the FET responsive to the comparing the rate of increase of current flowing through the FET.

In at least one example, the method further includes: comparing the current flowing through the FET to a threshold that is a predetermined percentage of a current limit; and enabling reducing the pull up current to the gate terminal of the FET responsive to the comparing. In another example, the method further includes after reducing the current at the gate terminal of the FET, operating the FET to supply current at the output terminal at the current limit.

In another example, the method includes, after reducing the current at the gate terminal of the FET, operating the FET to supply current at the output terminal at the predetermined current limit.

In another example, the method of coupling the current conduction path of a FET between the supply voltage terminal and an output terminal for supplying current further includes coupling a drain terminal of the FET to a voltage supply and coupling a source terminal of the FET to the output terminal.

In yet another example, the method of coupling the current conduction path of a FET between the supply voltage and an output terminal for supplying current further includes coupling the drain terminal to a terminal for supplying current and coupling the source terminal to a terminal for receiving a ground potential.

In a further example, the method further includes supplying an increased voltage that is greater than a supply voltage. In still another example, the method of comparing the sensed current flowing through the FET to a predetermined current limit includes comparing the sensed current to an adjustable current limit that is stored in a writeable storage circuit.

In yet another example, an integrated circuit includes: a terminal for driving a gate of a power FET having a current conduction path coupled between a voltage supply and a load; an voltage input terminal for coupling a supply voltage to the integrated circuit; a pull up bias circuit coupled to the terminal for driving the gate terminal of the power FET and to the input terminal for coupling the increased power supply; a current sensing circuit coupled to terminals to receive a voltage proportional to the current flowing in the power FET, and having a sensed current output; a current limit comparator comparing the sensed current to a limit current; a pull down current circuit coupled to the current limit comparator and to the terminal for driving the gate of the power FET; a current time derivative circuit coupled to the sensed current; and a pull-up current reduction circuit coupled to the current time derivative circuit and to the pull up bias circuit.

In still another example, the integrated circuit further includes the limit current set by an adjustable trim current supply.

Modifications are possible in the described embodiments, and other embodiments are possible within the scope of the claims.

What is claimed is:

1. An apparatus, comprising:
   an FET having a drain terminal, a source terminal and a gate terminal;
   a first supply voltage coupled to supply current to a current conduction path between the source terminal and the drain terminal of the FET;
   an output terminal coupled to receive current flowing through the current conduction path of the FET;
   a bias current supply coupled to the gate terminal of the FET;
   a second supply voltage coupled to the gate terminal of the FET;
   a current sensing circuit coupled to output a sense current proportional to the current flowing through the FET;
   a current limit comparator coupled to the sense current and comparing the sense current to a predetermined limit current;
   a pull down current circuit coupled to the current limit comparator and coupled to remove current from the gate terminal of the FET;
   a current time derivative circuit coupled to the sense current and outputting a sense rate current; and
   a circuit coupled to receive the sense rate current and coupled to the bias current supply.

2. The apparatus of claim 1, and further including an enable output coupled from the current limit comparator to the pull down current circuit.

3. The apparatus of claim 1, and further including circuitry to reduce the bias current to the gate terminal of the FET responsive to the sense rate current.

4. The apparatus of claim 1, in which the predetermined limit current is programmable.

5. The apparatus of claim 4, in which the predetermined limit current is stored to a writeable storage circuit.

6. The apparatus of claim 1, in which the current time derivative circuit coupled to the sense current includes a current rate detection circuit for outputting the sense rate current when the rate of increase of the sense current exceeds a predetermined threshold.

7. The apparatus of claim 1, and further including:
   an enable circuit coupled between the sense rate current and the bias current supply; and
   a current rate enable comparator circuit coupled to the sense current and to a reference current, and outputting an enable signal to the enable circuit.

8. The apparatus of claim 7, in which the current rate enable comparator circuit includes a scaling factor and the current rate enable comparator circuit compares a difference between the sense current and a multiplied product of the scaling factor and the predetermined limit current to the reference current.

9. The apparatus of claim 8, in which the scaling factor is programmable.

10. The apparatus of claim 9, and including a programmable storage circuit storing the scaling factor.

11. The apparatus of claim 10, and including an external bus interface coupled to address the programmable storage circuit.

12. A method, comprising:
    receiving an enable signal;
    coupling a current conduction path of an FET between a supply voltage terminal and an output terminal for supplying current;
    coupling a voltage and a pull up bias current to a gate terminal of the FET;
    sensing current flowing through the FET;
    comparing the sensed current flowing through the FET to a predetermined current limit;
    reducing the current at the gate terminal of the FET, responsive to comparing the current flowing through the FET to the predetermined current limit;
    comparing a rate of increase of current flowing through the FET to a rate increase threshold; and
    reducing the pull up bias current to the gate terminal of the FET responsive to the comparing the rate of increase of current flowing through the FET.

13. The method of claim 12, where comparing the rate of increase of current flowing through the FET further includes:
    comparing the current flowing through the FET to a threshold that is a predetermined percentage of the predetermined current limit; and
    enabling reducing the pull up bias current to the gate terminal of the FET, responsive to the comparing.

14. The method of claim 12, and further including, after reducing the current at the gate terminal of the FET, operating the FET to supply current at the output terminal at the predetermined current limit.

15. The method of claim 12, in which coupling the current conduction path of the FET between the supply voltage terminal and the output terminal for supplying current further includes coupling a drain terminal of the FET to a supply voltage and coupling a source terminal of the FET to the output terminal.

16. The method of claim 12, in which coupling the current conduction path of the FET between the supply voltage and the output terminal for supplying current further includes coupling a drain terminal of the FET to a terminal for supplying current and coupling a source terminal of the FET to a terminal for receiving a ground potential.

17. The method of claim 12, in which coupling the voltage and the pull up bias current to the gate terminal of the FET further includes supplying an increased gate voltage that is greater than a supply voltage.

18. The method of claim 12, in which comparing the sensed current flowing through the FET to the predetermined current limit includes comparing the sensed current to an adjustable current limit that is stored in a writeable storage circuit.

19. An integrated circuit, comprising:
- a terminal for driving a gate of a power FET having a current conduction path coupled between a voltage supply and a load;
- a voltage input terminal for coupling a supply voltage to the integrated circuit;
- a pull up bias circuit coupled to the terminal for driving the gate of the power FET and to the voltage input terminal for coupling an increased power supply;
- a current sensing circuit coupled to the voltage input terminal to receive a voltage proportional to the current flowing in the power FET, and having a sensed current output;
- a current limit comparator comparing the sensed current to a current limit;
- a pull down current circuit coupled to the current limit comparator and to the terminal for driving the gate of the power FET;
- a current time derivative circuit coupled to the sensed current; and
- a current reduction circuit coupled to the current time derivative circuit and to the pull up bias circuit.

20. The integrated circuit of claim 19, and further including an adjustable trim current supply to set the current limit.

* * * * *